United States Patent
Reynolds et al.

(10) Patent No.: US 8,740,444 B2
(45) Date of Patent: Jun. 3, 2014

(54) LIGHT SOURCE CIRCUIT BOARDS

(75) Inventors: Dale Reynolds, Hingham, MA (US); Gregory Campbell, Walpole, MA (US)

(73) Assignee: Lumenpulse Lighting, Inc. (CA)

( * ) Notice: Subject to any disclaimer, the term of this patent is extended or adjusted under 35 U.S.C. 154(b) by 337 days.

(21) Appl. No.: 13/332,685

(22) Filed: Dec. 21, 2011

(65) Prior Publication Data

US 2013/0162173 A1   Jun. 27, 2013

(51) Int. Cl.
*F21V 7/04* (2006.01)

(52) U.S. Cl.
USPC ........... 362/631; 362/611; 362/612; 361/761; 361/766; 361/774; 315/51; 315/297; 315/312

(58) Field of Classification Search
CPC .......... H05K 3/00; H05K 2201/09218; H05K 2201/10; H05K 2201/10022; H05K 2201/10045; H05K 2201/10106; H01L 21/66; H01L 21/70; H01L 21/77
USPC ............ 362/249.02, 611, 612, 630, 631, 800; 361/748, 761, 763, 764, 766, 774; 315/51, 297, 312, 362, 224; 324/763.01
See application file for complete search history.

(56) References Cited

U.S. PATENT DOCUMENTS

| | | | |
|---|---|---|---|
| 5,146,172 A | 9/1992 | Mehr-Ayin et al. | |
| 6,946,862 B2 | 9/2005 | Kosuga | |
| 7,394,729 B2 | 7/2008 | Claseman | |
| 8,127,477 B2 * | 3/2012 | Lowenthal et al. | 40/446 |
| 8,319,429 B2 * | 11/2012 | Wu et al. | 313/512 |
| 2008/0042701 A1 | 2/2008 | Weiss et al. | |
| 2012/0081411 A1 * | 4/2012 | Lee et al. | 345/690 |
| 2013/0120993 A1 * | 5/2013 | Fan et al. | 362/249.02 |

* cited by examiner

*Primary Examiner* — Haiss Philogene

(74) *Attorney, Agent, or Firm* — Burns & Levinson LLP; Joseph M. Maraia

(57) ABSTRACT

Methods for manufacturing a light source circuit board having one or more light emitting components that include providing at least one circuit component on a light source circuit board, wherein the at least one circuit component has an electrical circuit constant that specifies one or more performance parameters for the light source. The methods also include measuring the electrical circuit constant of the at least one circuit component. The methods also include identifying one or more performance parameters for the light source based on the measured electrical constant.

18 Claims, 3 Drawing Sheets

LIGHT SOURCE CIRCUIT BOARDS

FIELD OF THE INVENTION

The currently described invention relates to light source circuit boards and methods for manufacturing light source circuit boards.

BACKGROUND

Light source products are often made available to consumers for a range of applications. Each application has different requirements and, therefore, manufacturers make different products available to meet each of the different application-specific requirements. In many cases, a product for one application may not be readily discernable from a product for a different application because discrete electrical components in the products may be the only discriminating feature, and it is difficult to visually identify the difference between these electrical components. This makes it difficult to distinguish between products during the manufacturing process. A need therefore exists for improved methods and systems for manufacturing light source circuit boards.

SUMMARY

The invention, in one aspect, features a method for manufacturing a light source circuit board having one or more light emitting components. The method includes providing at least one circuit component on a light source circuit board, wherein the at least one circuit component has an electrical circuit constant that specifies one or more performance parameters for the light source. The method also includes measuring the electrical circuit constant of the at least one circuit component. The method also includes identifying one or more performance parameters for the light source based on the measured electrical constant.

In some embodiments, the light source performance parameters are selected from the group consisting of light source color temperature, the circuit board power input requirement, or the light source model identifier. In some embodiments, the circuit board includes a plurality of potential component locations and the method includes placing the at least one circuit component in a particular component location to specify one or more of the light source performance parameters based on the particular component location on the circuit board. In some embodiments, the method includes electrically coupling the at least one circuit component to one or more light emitting diodes on the circuit board to alter the circuit board electrical circuit properties specific to the one or more of the light source performance parameters.

In some embodiments, the method includes selecting the electrical circuit constant to configure the circuit board to cause the light source to emit in a prespecified range of color temperatures based on the electrical circuit constant. In some embodiments, the at least one circuit component includes a resistor and a signal generated based on a voltage drop across the resistor is provided to a microprocessor of the circuit board to control particular light source functionality. In some embodiments, the microprocessor enables or disables the particular light source functionality in response to the signal. In some embodiments, the particular light source functionality is color temperature range or allowable power level settings. In some embodiments, the one or more light emitting components are one or more light emitting diodes.

The invention, in another aspect, features a light source circuit board having one or more light emitting components. The circuit board includes at least one circuit component on the light source circuit board, wherein the at least one circuit component has an electrical circuit constant that specifies one or more performance parameters for the light source. The circuit board also includes measurement terminals on the circuit board for measuring the electrical circuit constant of the at least one circuit component. One or more performance parameters for the light source are specified based on the electrical constant of the at least one circuit component.

In some embodiments, the light source performance parameters are selected from the group consisting of light source color temperature, the circuit board power input requirement, or the light source model identifier. In some embodiments, the circuit board includes a plurality of potential component terminal locations and wherein the at least one circuit component is located in a particular component location to specify one or more of the light source performance parameters based on the particular component location on the circuit board. In some embodiments, the circuit board includes an electrical circuit trace electrically coupling the at least one circuit component to one or more light emitting diodes on the circuit board to set the circuit board electrical circuit properties specific to the one or more of the light source performance parameters.

In some embodiments, the electrical circuit constant is selected to configure the circuit board to cause the light source to emit in a prespecified range of color temperatures based on the electrical circuit constant. In some embodiments, the at least one circuit component includes a resistor and microprocessor, and wherein a voltage drop across the resistor generates a signal that is provided to a microprocessor of the circuit board to control particular light source functionality. In some embodiments, the microprocessor is configured to enable or disable the particular light source functionality in response to the signal. In some embodiments, the particular light source functionality is color temperature range or allowable power level settings. In some embodiments, the one or more light emitting components are one or more light emitting diodes.

The circuit boards and manufacturing methods (hereinafter "technology") described herein can provide one or more of the following advantages. An advantage of the technology is that the selective use of circuit components on light source circuit boards enables, for example, the manufacturer or end user to identify the performance parameters associated with a particular circuit board without having to track the board during the manufacturing process. Another advantage involves reducing human error in identifying circuit boards because the methods described allow for automatic testing of the circuit boards to discern performance parameters for the board. Another advantage of the technology is that different performing circuit boards can be identical except for one or more electrical components provided on the circuit board that specify/set specific performance parameters for the circuit boards.

Other aspects and advantages of the current invention will become apparent from the following detailed description, taken in conjunction with the accompanying drawings, illustrating the principles of the invention by way of example only.

BRIEF DESCRIPTION OF THE DRAWINGS

The foregoing features of various embodiments of the invention will be more readily understood by reference to the following detailed descriptions in the accompanying drawings, in which.

DETAILED DESCRIPTION OF ILLUSTRATIVE EMBODIMENTS

Embodiments described herein help verify circuit board assembly processes and help differentiate between circuit boards that otherwise look identical to the human eye. In some embodiments, the automated circuit board manufacturing equipment performs the necessary steps to verify assembly processes and differentiate between the different circuit boards. In addition, the exemplary methods described enable the manufacturer to use one set of firmware code loaded into the different board types because the circuit components used to distinguish between different types of boards also specify performance parameters for the different types of boards.

Figure 1A:
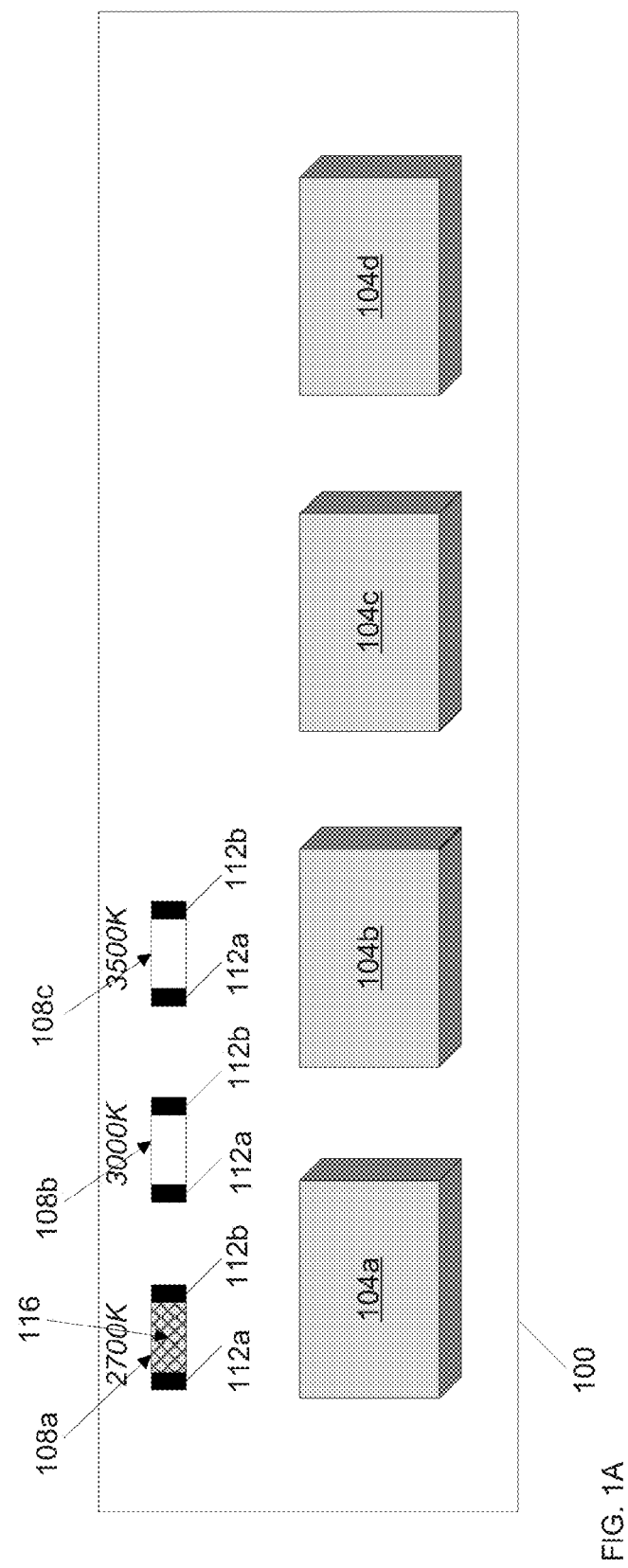
FIG. 1A is a schematic illustration of a light source circuit board, according to an illustrative embodiment.

FIG. 1A is a schematic illustration of a light source circuit board 100, according to an illustrative embodiment. The circuit board 100 includes four light emitting components 104a, 104b, 104c, and 104d (generally 104). The light emitting components 104 can be, for example, light emitting diodes, liquid crystal displays, or a combination thereof. The circuit board 100 also includes three potential component locations 108a, 108b, and 108c (generally 108) for mounting circuit components to the circuit board 100. Each component location 108 also includes a pair of measurement terminals 112a and 112b configured for measuring the electrical circuit constant of circuit components mounted to the circuit board 100. The circuit board 100 also includes one circuit component 116 mounted to the circuit board 100 at component location 108a.

In this embodiment, the component location used for the circuit component 116 specifies a performance parameter for a light source that includes the light source circuit board 100. In this embodiment, the particular location (selected from locations 108a, 108b, and 108c) of the circuit component 116 specifies the light source color temperature. Component location 108a corresponds to a color temperature of 2700K, component location 108b corresponds to a color temperature of 3000K, and component location 108c corresponds to a color temperature of 3500K. Because the circuit board 100 includes a circuit component mounted in component location 108a, the circuit board 100 will produce light with a 2700K color temperature in operation. In this embodiment, by associating meaning to specific a component location 108, a visual indicator is provided corresponding to performance of the circuit board 100 when integrated into a light source.

In alternative embodiments, the component locations 108 may specify one or more performance parameters for light sources that incorporate the circuit board 100. For example, in some embodiments, the circuit board 100 is configured such that the component locations specify the light source color temperature, the circuit board power input requirement, the light source model identifier, or a combination thereof. In some embodiments, the electrical circuit constant of the circuit component provided on the circuit board 100 specifies one or more performance parameters for a light source that incorporates the circuit board 100. In one embodiment, the circuit components used are resistors. The specific measured resistance of the circuit component 116 specifies the color temperature of the light emitted by a light source that incorporates the circuit board 100. The electrical constant of a resistive circuit component provided on the circuit board 100 can be measured using, for example, an ohm meter coupled to the measurement terminals 112a and 112b of the component locations 108. In some embodiments, an automated circuit board tester is used to determine the performance parameters associated with a particular circuit board.

Figure 1B:
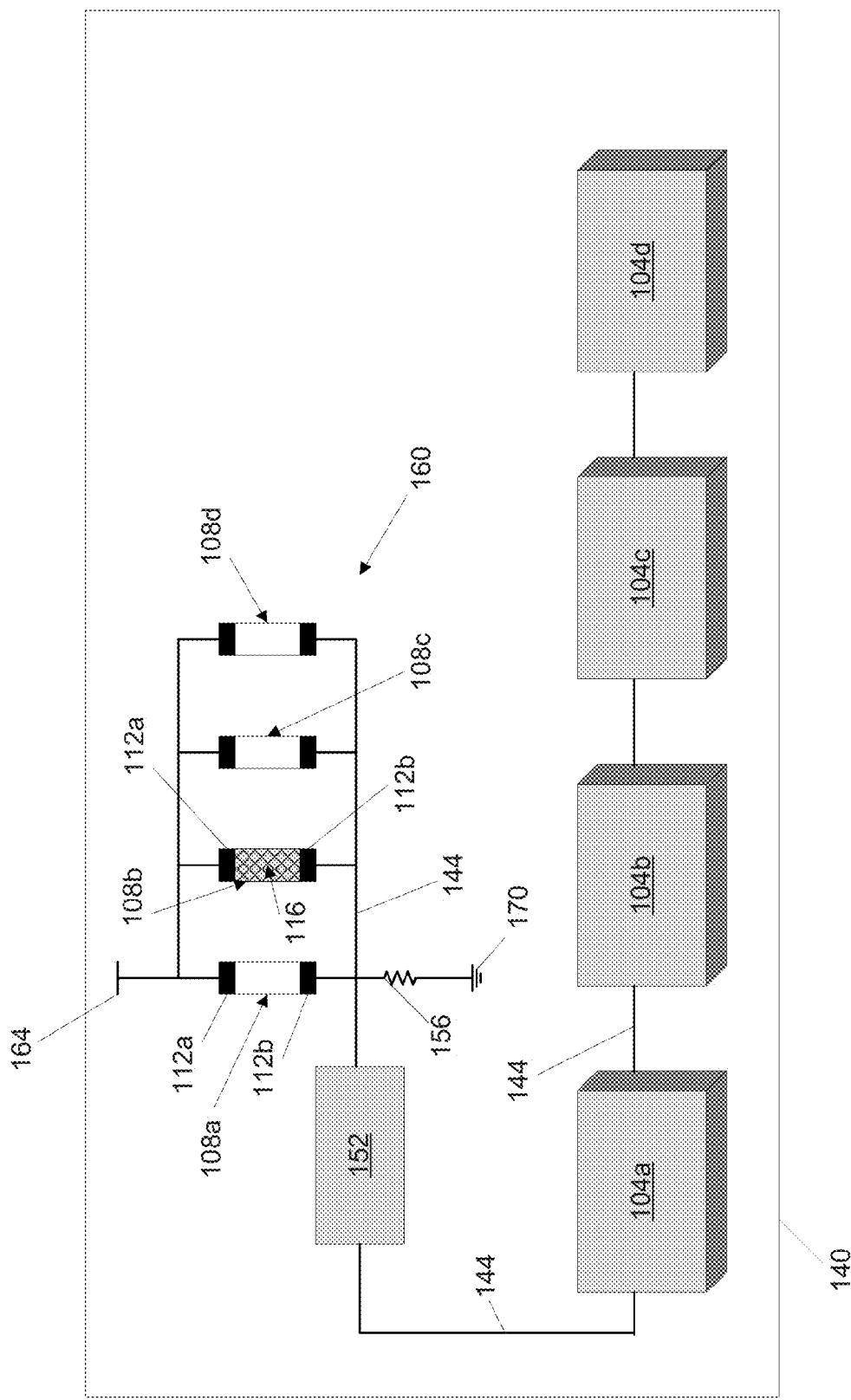
FIG. 1B is a schematic illustration of a light source circuit board, according to another illustrative embodiment.

FIG. 1B is a schematic illustration of a light source circuit board 140, according to another illustrative embodiment. The circuit board 140 includes four light emitting components 104a, 104b, 104c, and 104d (generally 104). The light emitting components 104 can be, for example, light emitting diodes, liquid crystal displays, or a combination thereof. The circuit board 140 also includes four potential component locations 108a, 108b, 108c, and 108d (generally 108) for mounting circuit components to the circuit board 140. Each component location 108 also includes a pair of measurement terminals 112a and 112b configured for measuring the electrical circuit constant of circuit components mounted to the circuit board 140.

The circuit board 140 also includes one circuit component 116 mounted to the circuit board 140 at component location 108a; however, in some embodiments, two or more circuit components can be mounted to two or more corresponding component locations. The circuit board 140 also includes electrical circuit traces 144 that are configured to electrically couple circuit components provided in one or more of the component locations 108 to one or more of the light emitting components 104. In this embodiment, the electrical circuit constant of the circuit component 116 specifies one or more performance parameters for a light source that includes the light source circuit board 140.

In this embodiment, the circuit component 116 is a resistor electrically coupled to a microprocessor 152. The circuit component 116 is connected in series with a known, fixed resistor 156 to form a resistor divider circuit 160 between the circuit 160 voltage supply 164 (V+) and a ground 170. Depending on the electrical circuit constant (i.e., resistance value in this embodiment) of the circuit component 116, a different voltage will be generated across the known, fixed resistor 156. The voltage signal across the known, fixed resistor 156 is fed to an analog-to-digital (A/D) pin on the microprocessor 152. The A/D value is used by the microprocessor 152 to reference an operation in the microprocessor 152 that enables, disables, or varies particular light source functionality of the circuit board 140 in response to the signal, using the microprocessor 152. In some embodiments, the light emitting components 104 are circuit boards with light emitting diodes mounted to the circuit board. In some embodiments, there are one or more microprocessors, and the microprocessors are mounted to the light emitting components. An exemplary microprocessor is dsPIC® family digital signal controller that includes on-board A/D converters (Microchip Technology Inc.).

By way of example, the electrical circuit constant of the circuit component 116 affects the voltage generated across the known, fixed resistor 156. The voltage generated then causes the microprocessor 152 to vary command signals provided to the light emitting components 104. In one embodiment, the microprocessor 152 and circuit board 140 are configured such that the electrical circuit constant of the circuit component 116 causes the light source to emit in a prespecified range of color temperatures (e.g., 2700K-3000K).

In another example, the microprocessor 152 includes code operating on the microprocessor 152. The code specifies a specific sequence of illumination produced by the circuit board during its operation. For example, in one embodiment, the specific sequence of illumination includes varying both color produced by one or more light emitting components and the timing associated with the illumination that is produced (e.g., could be a sequence associated with a theatrical performance). The voltage signal generated by the fixed, known resistor 156 and provided to the microprocessor 152 causes the microprocessor 152 to control the circuit board to produce the specific sequence of illumination. In this manner, different voltage signals can be assigned to different illumination sequences. Each circuit board is therefore capable of generating each of the different illumination sequences; and a specific illumination sequence can be generated by changing one or more of the circuit components 116.

Figure 2:
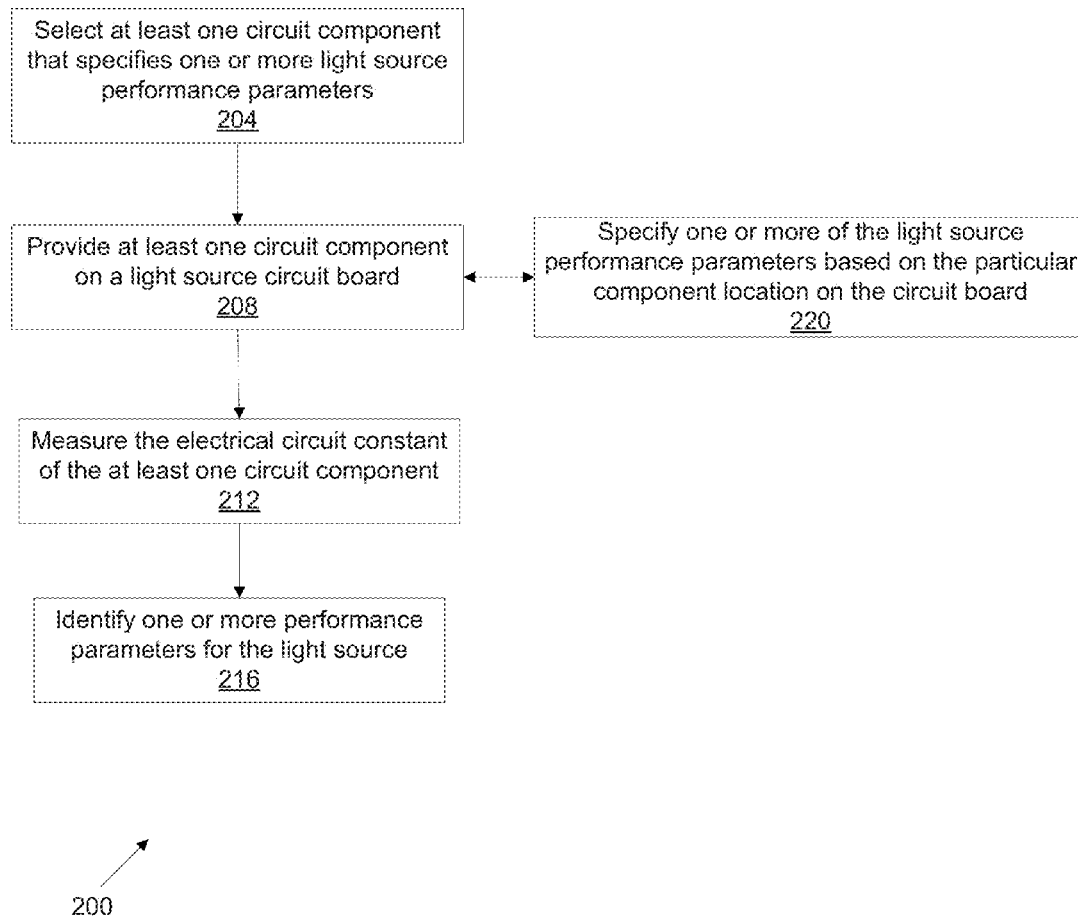
FIG. 2 is a flowchart of a method for manufacturing a light source circuit board, according to an illustrative embodiment.

FIG. 2 is a flowchart 200 of a method for manufacturing a light source circuit board, according to an illustrative embodiment. The method includes selecting 204 at least one circuit component that specifies one or more light source performance parameters. The method also includes providing 208 the at least one circuit component on a light source circuit board. The method also includes measuring 212 the electrical circuit constant of the at least one circuit component. The method also includes identifying 216 one or more performance parameters for the lights source based on the measured electrical constant.

In some embodiments, the light source performance parameters are one or more of the following: light source color temperature, the circuit board power input requirement, LED type, or the light source model identifier. In some embodiments, the circuit board includes a plurality of potential component locations and the method includes the step of placing the at least one circuit component in a particular component location to specify 220 one or more of the light source performance parameters based on the particular component location on the circuit board. In some embodiments, the method includes electrically coupling the at least one circuit component to one or more light emitting diodes on the circuit board to alter the circuit board electrical circuit properties specific to the one or more of the light source performance parameters.

In some embodiments, the method includes selecting the electrical circuit constant to configure the circuit board to cause the light source to emit in a prespecified range of color temperatures (e.g., 2500 k to 2700K, 2700K to 3000K, or 3000K to 3500K) based on the electrical circuit constant.

Comprise, include, and/or plural forms of each are open ended and include the listed parts and can include additional parts that are not listed. And/or is open ended and includes one or more of the listed parts and combinations of the listed parts.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

The invention claimed is:

1. A method for manufacturing a light source circuit board having one or more light emitting components, the method comprising:
providing at least one circuit component on the light source circuit board, wherein the at least one circuit component has an electrical circuit constant that specifies one or more performance parameters for the light source;
measuring the electrical circuit constant of the at least one circuit component; and
identifying one or more performance parameters for the light source based on the measured electrical constant.

2. The method of claim 1, wherein the light source performance parameters are selected from the group consisting of light source color temperature, the circuit board power input requirement, or the light source model identifier.

3. The method of claim 1, wherein the circuit board includes a plurality of potential component locations and the method includes placing the at least one circuit component in a particular component location to specify one or more of the light source performance parameters based on the particular component location on the circuit board.

4. The method of claim 3, comprising electrically coupling the at least one circuit component to one or more light emitting components on the circuit board to alter the circuit board electrical circuit properties specific to the one or more of the light source performance parameters.

5. The method of claim 1, comprising selecting the electrical circuit constant to configure the circuit board to cause the light source to emit in a prespecified range of color temperatures based on the electrical circuit constant.

6. The method of claim 1, wherein the at least one circuit component includes a resistor and a signal generated based on a voltage drop across the resistor is provided to a microprocessor of the circuit board to control particular light source functionality.

7. The method of claim 6, wherein the microprocessor enables or disables the particular light source functionality in response to the signal.

8. The method of claim 6, wherein the particular light source functionality is color temperature range or allowable power level settings.

9. The method of claim 1, wherein the one or more light emitting components are one or more light emitting diodes.

10. A light source circuit board having one or more light emitting components, the circuit board comprising:
at least one circuit component on the light source circuit board, wherein the at least one circuit component has an electrical circuit constant that specifies one or more performance parameters for the light source; and
measurement terminals on the circuit board for measuring the electrical circuit constant of the at least one circuit component,
wherein one or more performance parameters for the light source are specified based on the measured electrical constant of the at least one circuit component.

11. The circuit board of claim 10, wherein the light source performance parameters are selected from the group consisting of light source color temperature, the circuit board power input requirement, or the light source model identifier.

12. The circuit board of claim 10, comprising a plurality of potential component terminal locations and wherein the at least one circuit component is located in a particular component location to specify one or more of the light source performance parameters based on the particular component location on the circuit board.

13. The circuit board of claim 10, comprising an electrical circuit trace electrically coupling the at least one circuit component to one or more light emitting components on the circuit board to set the circuit board electrical circuit properties specific to the one or more of the light source performance parameters.

14. The circuit board of claim 10, wherein the electrical circuit constant is selected to configure the circuit board to cause the light source to emit in a prespecified range of color temperatures based on the electrical circuit constant.

15. The circuit board of claim 10, wherein the at least one circuit component includes a resistor and microprocessor, and wherein a voltage drop across the resistor generates a signal that is provided to a microprocessor of the circuit board to control particular light source functionality.

16. The circuit board of claim 15, wherein the microprocessor is configured to enable or disable the particular light source functionality in response to the signal.

17. The circuit board of claim 15, wherein the particular light source functionality is color temperature range or allowable power level settings.

18. The circuit board of claim 10, wherein the one or more light emitting components are one or more light emitting diodes.

* * * * *